(12) United States Patent
Gadgil

(10) Patent No.: US 6,812,157 B1
(45) Date of Patent: Nov. 2, 2004

(54) APPARATUS FOR ATOMIC LAYER CHEMICAL VAPOR DEPOSITION

(76) Inventor: Prasad Narhar Gadgil, 301 Rosemont Dr., Santa Clara, CA (US) 95051

( * ) Notice: Subject to any disclaimer, the term of this patent is extended or adjusted under 35 U.S.C. 154(b) by 185 days.

(21) Appl. No.: 10/019,244

(22) PCT Filed: Jun. 23, 2000

(86) PCT No.: PCT/US00/17202

§ 371 (c)(1),
(2), (4) Date: May 20, 2002

(87) PCT Pub. No.: WO00/79019

PCT Pub. Date: Dec. 28, 2000

Related U.S. Application Data

(60) Provisional application No. 60/141,111, filed on Jun. 24, 1999.

(51) Int. Cl.[7] .................. C23C 16/00; H21L 21/31; C30B 25/00; C30B 28/12; C30B 28/14
(52) U.S. Cl. .................. 438/763; 438/761; 438/762; 427/255.7; 117/88; 117/98; 117/200; 118/715; 118/725; 118/730
(58) Field of Search .................. 118/715, 725, 118/728–730; 117/88, 98, 200; 427/255.7; 438/761–763; 428/543

(56) References Cited

U.S. PATENT DOCUMENTS

| | | | |
|---|---|---|---|
| 4,993,357 A | 2/1991 | Scholz | 118/715 |
| 5,242,530 A | 9/1993 | Batey et al. | 156/613 |
| 5,256,205 A | 10/1993 | Schmitt, III et al. | 118/723 |
| 5,281,274 A | 1/1994 | Yoder | 118/697 |
| 5,316,793 A | 5/1994 | Wallace et al. | 427/248.1 |
| 5,342,660 A | 8/1994 | Cann et al. | 427/577 |
| 5,443,647 A * | 8/1995 | Aucoin et al. | 118/723 ME |
| 5,456,945 A * | 10/1995 | McMillan et al. | 427/252 |
| 5,551,985 A * | 9/1996 | Brors et al. | 118/725 |
| 5,637,146 A * | 6/1997 | Chyi | 117/200 |
| 5,716,484 A * | 2/1998 | Blackburn et al. | 156/345.26 |
| 5,810,942 A | 9/1998 | Narayanswami et al. | 134/7 |
| 5,879,459 A | 3/1999 | Gadgil et al. | 118/715 |
| 6,189,485 B1 * | 2/2001 | Matsuda et al. | 118/723 E |
| 6,200,389 B1 * | 3/2001 | Miller et al. | 118/729 |
| 6,634,314 B2 * | 10/2003 | Hwang et al. | 118/723 R |

FOREIGN PATENT DOCUMENTS

| | | |
|---|---|---|
| EP | 0015390 | 9/1980 |
| JP | 62-284078 | * 12/1987 |

OTHER PUBLICATIONS

Hurle, D.T.J., "Thin Films and Epitaxy," Handbook of Crystal Growth, vol. 3, 1994, pp. 606–663.

Liu, H. et al., "GaAs Atomic Layer Epitaxy in a Rotating Disc Reactor," SPIE, vol. 1676, 1992, pp. 20–25.

McIntosh, F.G. et al., "Silicon Monolayer Growth Using Dichlorosilane and Hydrogen in a Near Atmospheric Pressure Chemical Vapor Deposition Reactor," Thin Solid Films 225, 1993, pp. 183–185.

(List continued on next page.)

*Primary Examiner*—Jeffrie R. Lund
(74) *Attorney, Agent, or Firm*—Sawyer Law Group LLP

(57) ABSTRACT

An atomic layer deposition (ALD) reactor (13) is disclosed that includes a substantially cylindrical chamber (15) and a wafer substrate (22) mounted within the chamber (15). The ALD reactor (13) further includes at least one injection tube (14) mounted within the chamber (15) having a plurality of apertures (32) along one side that directs gas emanating from the apertures (32) towards the wafer substrate (22). While gas is pulsed from the injection tube (14), either the wafer substrate (22) or the injection tube (14) is continuously rotated in a longitudinal plane within the chamber (15) to ensure complete and uniform coverage of the wafer substrate (22) by the gas.

19 Claims, 14 Drawing Sheets

OTHER PUBLICATIONS

Reid, K.G. et al, "The Role of Gas Phase Decomposition in the Ale Growth of III–V Compounds," North Carolina State University, Electrical & Computer Engineering Dept., Raleigh, NC., pp. 133–138.

Sumakeris, J. et al., "Layer–by–Layer Epitaxial Growth of GaN at Low Temperatures," Thin Solid Films, 1993, pp. 244–249.

Usui, Akira, "Atomic Layer Epitaxy of III–V Compounds: Chemistry and Applications," Proceedings of the IEEE, vol. 80, No. 10, Oct. 1992, pp. 1641–1653.

* cited by examiner

APPARATUS FOR ATOMIC LAYER CHEMICAL VAPOR DEPOSITION

CROSS-REFERENCE TO RELATED APPLICATIONS

The application is claiming priority under 35 U.S.C. §1.19 and §1.19(e) the benefit of International Application No. PCT/US00/17202, filed Jun. 23, 2000 and U.S. Provisional Application No. 60/141,111, filed Jun. 24, 1999.

FIELD OF THE INVENTION

The present invention relates to thin film deposition at a single atomic layer precision for manufacturing of semiconductor devices. More particularly, this invention describes a variety of apparatus configurations to enable atomic layer chemical vapor deposition of thin films of various materials on the surface substrate.

BACKGROUND OF THE INVENTION

The manufacturing of advanced integrated circuits (ICs) the microelectronic industry is accomplished through numerous and repetitive steps of deposition, patterning and etching of thin films on the surface of a silicon wafer. An extremely complex, monolithic and three dimensional structure with complex topography of variety of thin film materials such as semiconductors, insulators and metals is generated in a typical IC fabrication process. The present trend in the ICs, which is going to continue in the foreseeable future, is to increase the wafer size and decrease the critical device dimensions. As an example, the silicon wafer size has progressed in recent years from 150 mm to 200 mm and now to 300 mm and the next wafer size of 400 mm is on the horizon. Simultaneously, the critical device dimension has decreased from 0.35 micron to 0.25 micron to 0.18 micron. Research and development for the future device dimension devices at 0.13 and next to 0.10-micron technologies is being conducted by several leading IC manufacturers. Such steps are necessary to increase the device speed, sophistication, capability and yield. These trends in the IC production technology have placed extremely stringent and divergent demands on the performance of semiconductor manufacturing equipment that deposit, pattern or etch progressively smaller device structures on the surface of a silicon wafer. This in turn translates into extremely precise control of the critical process parameters such as film thickness, morphology, and conformal step coverage over complex topography and uniformity over an increasingly large area wafer surface.

Various well-developed and established technologies for thin film deposition are being practiced in the IC industry at present, the most prominent being chemical vapor deposition (CVVD) and physical vapor deposition (PVD). Both of these techniques, however, are flux dependent. This means that the number of gaseous species impinging per unit area of the wafer surface must be constant. In a conventional CVD process, the gas mixture is sprayed evenly from a larger diameter showerhead, with hundreds of pinholes in it, facing directly opposite the wafer. With increasing wafer diameter, this entails an even larger showerhead with larger number of pinholes with a strict condition that each pinhole must receive equal amount of gas all the time. An even worse situation is encountered when two or more gases, that are spontaneously reactive towards each other, are required to deposit a thin film. In such a case, the operation of a CVD reactor to deposit large area thin films becomes an extremely difficult task.

Moreover, temperature uniformity of the deposition surface plays an extremely crucial role in affecting the rate of film deposition. This factor being rather crucial in CVD as compared to PVD. In a practical example, the wafer temperature must be maintained at +/−1 degree C. at 500 degree C. This leads to complex and expensive heater designs and temperature control hardware and ultimately to added cost and complexity. The average rate of film deposition in CVD mode can be tailored over a wide range. The rate of deposition may be as high as 1000 A/min to as low as 100 A/min. However, yet another fundamental shortcoming of CVD being a dynamic process (and PVD also) is extremely low degree of film uniformity below a certain minimum value of thickness, typically below 200 Å (Angstrom). With complex device topography, this limitation is exacerbated to bring highly non-uniform film deposition.

The PVD process requires a high vacuum apparatus to throw vaporized material in cluster form towards the surface of the wafer. This leads to poor control on film deposition rate, expensive apparatus, and also limitations on the type of materials to be deposited. Also, the PVD being a line of sight process is much less amenable to achieve conformal film deposition over a complex topography. Such fundamental attributes of these prevalent film deposition technologies place severe constraints on the equipment performance, their scale-up and result in to deficiencies in process control that are being increasingly and rapidly felt as the rapid progress towards smaller device dimensions and larger wafer diameter continues.

A variant of CVD called rapid thermal CVD (RTCVD) is being employed recently to achieve precise control on film deposition rate. In a typical RTCVD process, the wafer is rapidly heated or cooled by radiation from switching on and off a large bank of high power lamps to the desired reaction temperature. Simultaneously, the wafer is exposed to reactive gases. The optimum temperature thus achieved for desired time duration acts like a reaction switch. Further process control can be achieved by simultaneously switching the gas flow towards the wafer. This technique, though rapidly emerging, has some serious drawbacks. First, rapid heating and cooling may lead to wafer warping, slip and undesirable film stress. Second, RTCVD is invariably susceptible to complexities arising from undesirable deposition on windows, optical properties of chamber materials, expensive and complex hardware for optics and radiation control. Also required is the chamber construction material that can withstand rapid and repeated thermal shocks under high vacuum.

Atomic layer chemical vapor deposition (ALCVD or merely ALD) is a simple variant of CVD. It was invented in Finland in late 70's to deposit thin and uniform films of compound semiconductors, such as zinc sulfide. There are several attributes of ALD that make it an extremely attractive and highly desirable technique for its application to microelectronic industry. ALD is a flux independent technique and it is based on the principle of self-limiting surface reaction. It is also relatively temperature insensitive. In a typical ALD sequence two highly reactive gases react to form a solid film and a gaseous reaction by-product is formed. It is carried out in discrete steps as follows.

FIG. 1 is a schematic of a conventional ALD process cycle with two inert gas pulses and two reactive gas pulses. First a reactive gas (A) is pulsed over the wafer 10. The gas molecules saturate the wafer 10 surface by chemically reacting with it to conform to the contours of the surface. This process is called chemisorption. Next an inert gas (P) pulse is sent over the surface that sweeps away excess number of gas molecules that are loosely attached (physiosorbed) to the surface and thus a monolayer of highly reactive species is formed on the wafer 10 surface. Next the second reactive gas (B) is pulsed over the wafer 10 surface. This reacts rapidly with the monolayer of first gas already adsorbed and a desired film is formed with the elimination of the gaseous by-product. Again an inert gas pulse (P) is introduced that sweeps away by-product and an excess of the second type of reactive gas. The wafer 10 surface is thus covered by a monolayer of desired film (AB) that is as thin as a single atomic layer. The surface is left in a reactive state for the complete sequence to start over. The desired film is thickness is built by repeating the complete reaction sequence described above for definite number of times.

There are numerous practical advantages that ALD can offer over the state-of-the-art techniques such as CVD and RTCVD. Being a flux independent techniques ALD is transparent to the wafer size. It means in an ALD reactor a 300 mm wafer can be coated as simply and as precisely as a 150 mm wafer. ALD also considerably simplifies the reactor design. Also being a chemically driven process, it is much less temperature sensitive. ALD usually offers a temperature window that can be as wide as 10–15 degree C. as opposed to a precise, single numerical value as required in CVD. This simplifies the heater design and controls. Due to the surface saturation reaction mechanism of ALD, gas dynamics plays a relatively minor role in the operation of an ALD reactor. All such factors not only ensure tremendous simplification in the design and operation of equipment but also its scalability without much effort. With respect to process parameters, ALD offers an unprecedented level of process control. The film thickness is controlled in a digital fashion at a single atomic level, e.g. ~3 Å/cycle. Also, the ALD process being surface reaction controlled offers complete and ideal step coverage over complex topography of devices all over the wafer. High and spontaneous reactivity of two precursor gases brings extreme complications to the design and operation of a CVD reactor and adversely affects the film uniformity. In an ALD process, high and spontaneous reactivity of precursors is in fact highly desirable and is exploited to its advantage. Furthermore, in an ALD sequence, the reaction is carried to completion. This ensures complete removal of undesirable reaction by-products from the film. The completion of reaction thus leads to films that are purer and contain much smaller number of defects as compared to their CVD counterparts.

The rate of deposition in ALD is almost fixed and is solely dependent upon the speed of completion of a single ALD sequence. For ALD to become acceptable to the microelectronic industry, it must offer competitive throughput. Hence, it is imperative to complete one ALD sequence comprising of four gas pulses in as short time as possible, in practical terms ~1 second. This places an upper limit on the film deposition rate at approx. 100–200 A/min., but with a precision of ~3 A. With continuously decreasing device dimensions, such features in ALD make the process of ALD highly desirable and applicable for several future device generations and for several future larger wafer diameters. An excellent description of the fundamentals and applications of ALD and the progress it has made so far is offered in a review article written by Tuomo Suntola in the Handbook of Crystal Growth, vol. 3, Thin Films and Epitaxy, Part B, (D. T. J. Hurle, editor), published by Elsevier Science B. V. in 1994.

Although in principle, the technique of ALD offers a variety advantages over the industry prevalent techniques such as CVD and PVD, it has not been commercialized so far. A currently available ALD system that is capable of depositing thin films on 50 mm×50-mm square substrates is mostly being used for early process development. As described above, ALD is a slower process than CVD or RTCVD with a rate of deposition almost 10 times as slow as the later ones. To overcome this disadvantage, an ALD batch processor system has been developed. In a batch process multiple substrates are coated simultaneously to increase the throughput. However, compared to a single wafer processor, batch processors have a few serious disadvantages such as inadequate process control, poor repeatability within the batch and from batch to batch, backside deposition on the wafer and cross contamination to note a few. Also, both of these ALD systems are based on the principle of transverse gas flow configuration above and across the heated substrate, in which a finite amount of reactive and/or inert gas is pulsed sequentially, as shown in FIG. 2.

FIG. 2 shows a compact ALD reactor 12 with transverse flow configuration in which the wafer 10 lies stationary within a narrow gap in the reactor and gases A, P, and B are pulsed in from one side of the reactor. This type of reactor design has some inherent and serious drawbacks. One drawback is that increasing substrate size requires increasingly longer gas pulse intervals, referred to as pulse widths because the gas has to traverse the full length (or width) of the substrate before the next pulse can be introduced. This increases the cycle time and further adversely affects throughput. It is must be reiterated here that ALD is basically a slower process. Also, such a reactor 12 configuration is inherently susceptible to adverse downstream mixing of reactive gases due to flow instabilities imposed by thermal convection. Moreover, in the transverse gas flow configuration, if the pulse width is shortened the reactive gas can be depleted downstream, leaving the trailing end of the substrate surface without any coating and thus seriously and adversely affecting the ALD process.

Thus, a compact, modular and single wafer Atomic Layer Deposition chamber that is capable of executing an ALD reaction sequence as fast as possible is highly desirable. The gas residence time t (or pulse width), in an ALD reactor is given by the equation:

$$t = L/v \qquad (1)$$

Here, v is the gas velocity and L is path length of the gas in the ALD reactor that is closely correlated to the substrate dimension. This relationship stipulates the shortest possible path length for gas flow. For efficient operation of the ALD reactor the gas residence time above the substrate must be as small as possible. However, the reactive gas during the pulse must completely and uniformly cover a substrate of any suitably large dimension.

A conventional CVD reactor configuration is a parallel plate type. The reactive gases or vapors are uniformly injected, through hundreds of small holes in a plate, that is called shower-head, perpendicularly on to a heated substrate surface that is directly opposite to it. Manifold plates behind the showerhead achieve the difficult task of equally distributing reactive gas mixture to each of the hundreds of holes. However, this invariably increases the gas path length tremendously. Thus a CVD reactor may be used to perform an ALD task in principle; however, in practice it is highly inefficient and thus unsuitable.

It is quite clear from the foregoing description of the advantages and the state-of-art of ALD reactor design that to become rapidly and successfully adaptable to the microelectronic industry, a unique and novel ALD reactor design must be introduced. Such a novel ALD reactor design must have all the following attributes:

(a) Stable fluid flow above the substrate and within the reactor,
(b) No depletion of reactive gas or vapor over the substrate surface,
(c) Shortest Path Length with rapid gas pulsing to enable rapid completion of an ALD cycle,
(d) Smallest internal volume for rapid gas exchange,
(e) Reactor configuration that can be maintained and components and hardware serviced without much difficulty to reduce the shut-down time,
(f) Reliability, compactness and conservative tool footprint, and
(g) Reproducible and repeatable processing, What is clearly required is a configuration or configurations of an Atomic Layer Deposition chamber that are unique and innovative to develop a stable fluid flow over the substrate with a minimum path length to cover the complete substrate surface uniformly. The minimum path length, coupled with stability of fluid flow, offers shortest pulse width and satisfies the throughput requirement with high degree of reproducibility.

SUMMARY OF THE INVENTION

The present invention provides an atomic layer deposition (ALD) reactor that includes a substantially cylindrical chamber and a substrate mounted within the chamber. The ALD reactor further includes at least one injection tube mounted within the chamber having a plurality of apertures along one side that direct gas emanating from the apertures towards the substrate. While gas is pulsed from the injection tube, either the substrate or the injection tube is continuously rotated in a longitudinal plane within the chamber to ensure complete and uniform coverage of the substrate by the gas.

In a preferred embodiment, the ALD reactor covers a wafer substrate with a gas deposition sequence comprising a first reactive gas (A), an inert gas (P), the second reactive gas (B), and the inert gas (P). In one embodiment of the ALD reactor, the wafer substrate is rotated in a horizontal plane in relation to the injection tube. In a second embodiment, the wafer substrate is stationery within the chamber and the injector tube is rotated in relation to the wafer substrate. In another embodiment, the ALD reactor includes three injection tubes mounted within the chamber in parallel, the first injection tube dispenses gas (A)?, the second injection tube dispenses gas (P)?, and the third injection tube dispenses gas B. In yet other embodiments, the at least one injection tube may be configured in a cross injector tube configuration, a radial gas injector configuration, as stacked circumferential O-rings, or as stacked longitudinal injectors.

Accordingly, the present invention improves the efficiency of an atomic layer chemical vapor deposition apparatus. A combination of relative motion of the substrate with one of the various gas injection configurations achieves complete wafer surface coverage without gas depletion in the shortest possible time frame. The gas injection configurations are highly suitable to realize large area, uniform and highly conformal atomic layer deposition with precise process control.

DETAILED DESCRIPTION

Figure 1:
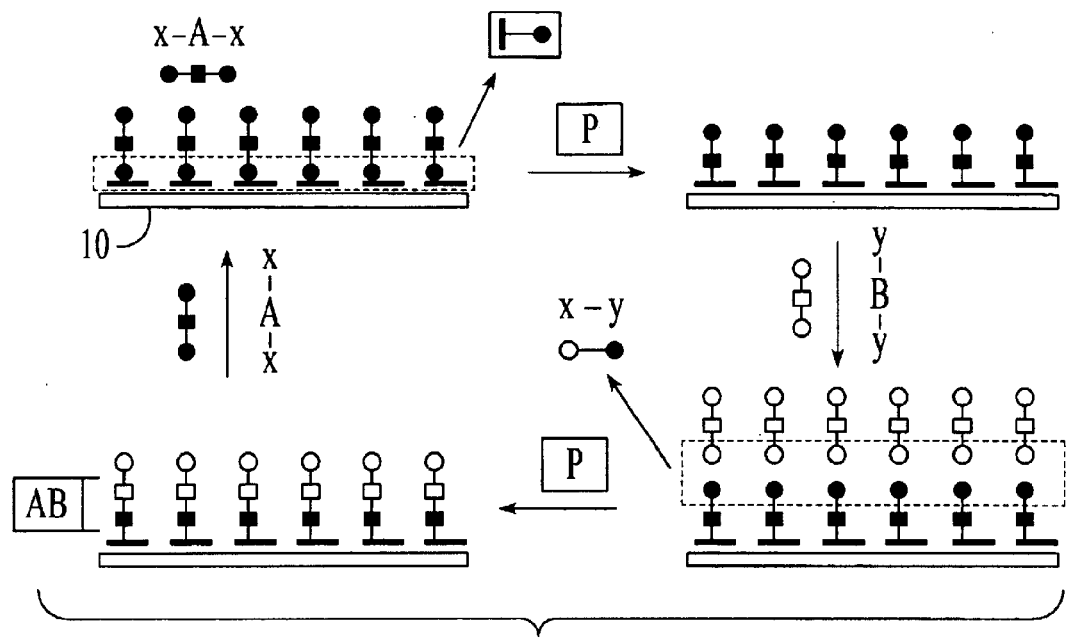
FIG. 1 shows the schematic of an ALD process cycle with two inert gas pulses and two reactive gas pulses.
Figure 2:
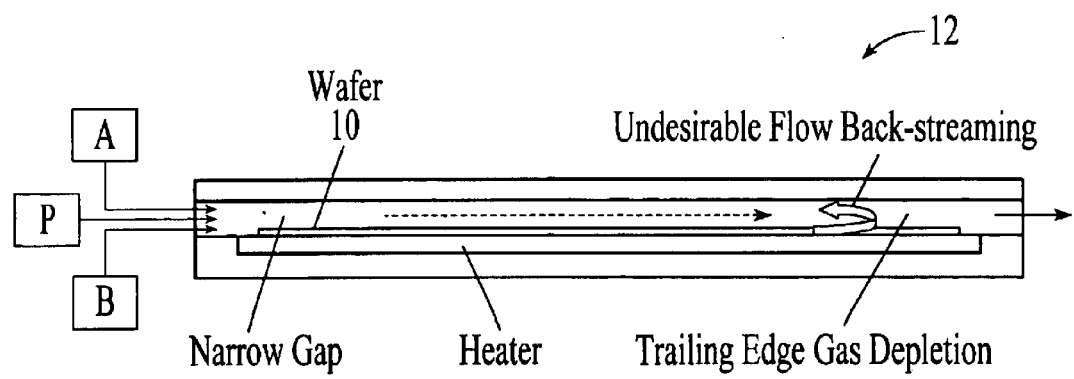
FIG. 2 shows the compact ALD reactor with transverse flow configuration.

The present invention relates to thin film deposition at a single atomic layer precision for manufacturing of semiconductor devices. The following description is presented to enable one of ordinary skill in the art to make and use the invention and is provided in the context of a patent application and its requirements. Various modifications to the preferred embodiment win be readily apparent to those skilled in the art and the generic principles herein may be applied to other embodiments. Thus, the present invention is not intended to be limited to the embodiment shown but is to be accorded the widest scope consistent with the principles and features described herein.

This pressing invention provides atomic layer deposition (ALD) apparatus configurations that can achieve complete wafer substrate coverage by reactive gases in a shortest path length with flow stability and in a compact volume. A combination of relative motion of the substrate with one of the various gas injection schemes in the form of projecting gas jets achieves complete surface coverage without gas depletion.

It is thus apparent to an individual skilled in the art that such an apparatus is a generic one in nature and is thus not limited by the reaction chemistry of synthesis of any desired film material. Hence, it has a secondary purpose to synthesize, using one or more embodiments described herein, a variety of thin films of metals, semiconductors and insulators and suitable combinations thereof with atomic level precision on a substrate under suitable process conditions.

It should be noted herein that the operational range of process development for the atomic layer deposition configurations is sufficiently wide with respect to pressure and temperature. At high pressures, the jets are confined to the vicinity of their respective axes whereas, at low pressure they tend to expand laterally. The suitable operational pressure range may be from 760 Torr to several milli-Torr. The reaction temperature is dependent upon the reaction chemistry. It is highly desirable to set the flow rate in ALD at the minimun, but sufficient to obtain complete and uniform surface coverage with the help of mass flow controllers, so as to maximize the usage of reactants.

In a preferred embodiment of the present invention a compact, shortest path length atomic layer chemical vapor deposition chamber (SPLAC) is provided, comprising a body that is substantially cylindrical in shape, such that the height is preferably less than its diameter. In which a substrate holder is co-axially mounted so as to define an annular gap there between. A substrate-processing region is adapted to enclose the substrate during processing. A load/unload port opening to the substrate-processing region is provided to transfer the substrate into and out of the substrate-processing region. A remotely operable vacuum valve is provided to open and close the load/unload port opening. The vacuum valve is adapted to provide a vacuum seal to the chamber in the closed position. The substrate-processing region is interposed between the gas injection region and the pedestal region that supports the substrate during processing. The gas injection region comprises one or more gas and vapor injection inlets, each with a suitable pneumatic valve that is normally closed and an upstream mass flow controller to measure the quantity of reactive gas and/or vapor flowing through it. The gas injection inlets open into the substrate-processing region. The pedestal region incorporates a heater that supplies the heat energy to the substrate to affect the desired chemical reaction and there are also cooling lines adapted to cool the body of the chamber and also the lid of the chamber that houses injector tubes. The pedestal is mounted co-axially to the body of the chamber, on a device that enables the rotation of the pedestal around its vertical common axis at a constant and pre-defined angular velocity. An exhaust exit is adapted suitably in the vicinity of the pedestal region for evacuating the gas and vapor from the chamber.

In the preferred embodiment, an injection tube with one end closed, or both ends closed with a center gas inlet, and with appropriately spaced flow openings along its length, is connected to the gas injection port that is connected to the gas or vapor source of a first type through a remotely operable pneumatic valve and a mass flow controller. The gas injection port is attached either at the center of the tube or at one of its ends. The portion of the tube with openings generally exceeds the diameter of the substrate. The injection tube is placed parallel to the and in close proximity of principle diagonal of the chamber. The tube faces the substrate such that the jets of gas or vapor emanating from the openings in it impinge directly on the diameter of the substrate at an angle that is preferably smaller than 90 degrees. In preferred embodiment, the value of this angle is approximately between 10 and 20 degrees with respect to the normal. A second tube, connected to a pneumatic valve that is connected to a mass flow controller that is connected to a gas or vapor source of second type, is spaced preferably parallel to the principle diagonal of the chamber in close proximity, but equi-distance opposite to the first tube from the principle diagonal. The gas and vapor jets emanating from the openings in the wall of the second tube impinge directly on the diameter of the substrate that is co-axially mounted on a pedestal. A third tube, with suitably spaced apertures along its wall that is connected to a pneumatic valve that is connected to a mass flow controller is mounted exactly along the principle diagonal of the chamber such that the jets emanating from it directly impinge on the diameter of the substrate. The gas injection tube, that is mounted directly along the principle diagonal, is connected to an inert or a non-reactive gas source such as N2 or Ar or He through a pneumatic valve and a mass flow controller.

Figure 3A:
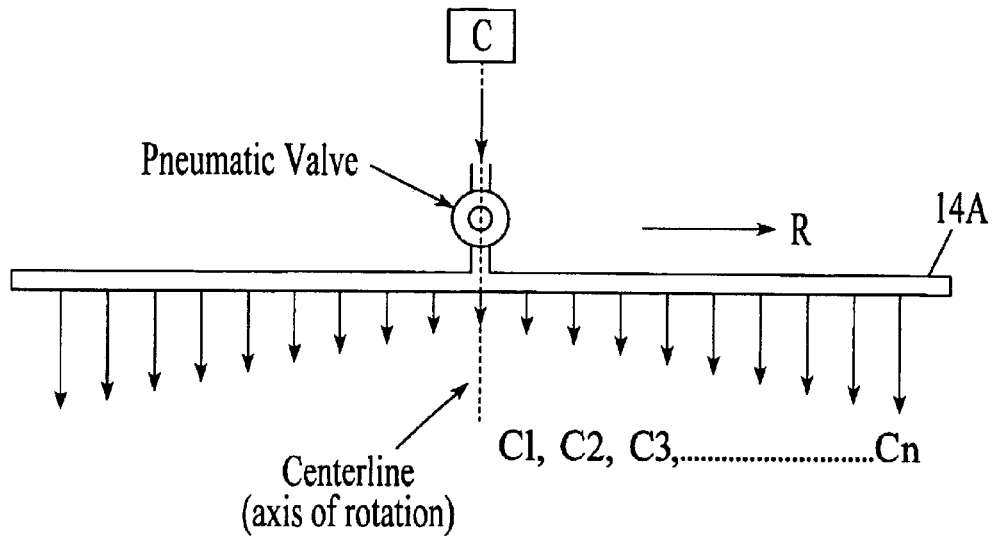
FIG. 3 shows configurations of injector tubes in an ALD reactor.
Figure 3B:
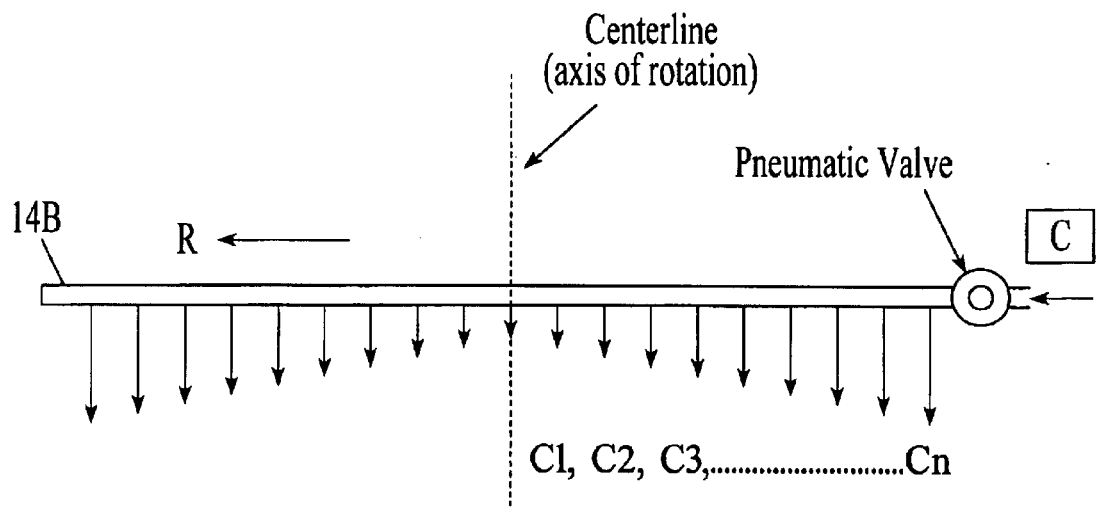

FIGS. 3A and 3B show configurations of injector tubes in an ALD reactor for use in a preferred embodiment of the present invention. Referring to FIG. 3A, an injector tube 14A is shown having apertures along its radius R (where R matches or exceeds the radius of the substrate), a center fed inlet of gaseous reactants of concentration C, and both ends of the tube closed. Radial concentrations C1, C2 . . . Cn increase towards the edge of the substrate, and the concentration profile is symmetric with respect to the centerline. FIG. 3B shows an end feed injector tube 14B having an end fed gas inlet of concentration C and the other end closed. Concentrations Cn . . . C2, C1 decrease towards the centerline and again symmetrically increase towards the trailing edge of the tube 14B past the centerline, in the direction of flow.

The adverse effects of depletion of the reactant within the tube and simultaneous increase in the area of the sector of the substrate that is proportional to the square of the radius, must be countered appropriately. It is highly important for the efficient operation of the ALD reactor, in such a configuration, that the amount of gaseous reactant being ejected on the substrate diagonal increases proportionately as it progresses radially outward from the center in both directions within the tube. This is achieved by one or more means as follows:

(a) Altering the spacing between the apertures symmetrically from the center of the injector tube, (b) Increasing the number of apertures per unit length in outward direction from the center of the injector tube, (c) Increasing the width of apertures spaced away from the center of the injector tube, and/or, (d) Varying the internal flow cross section of the injector tube appropriately.

Figure 4A:
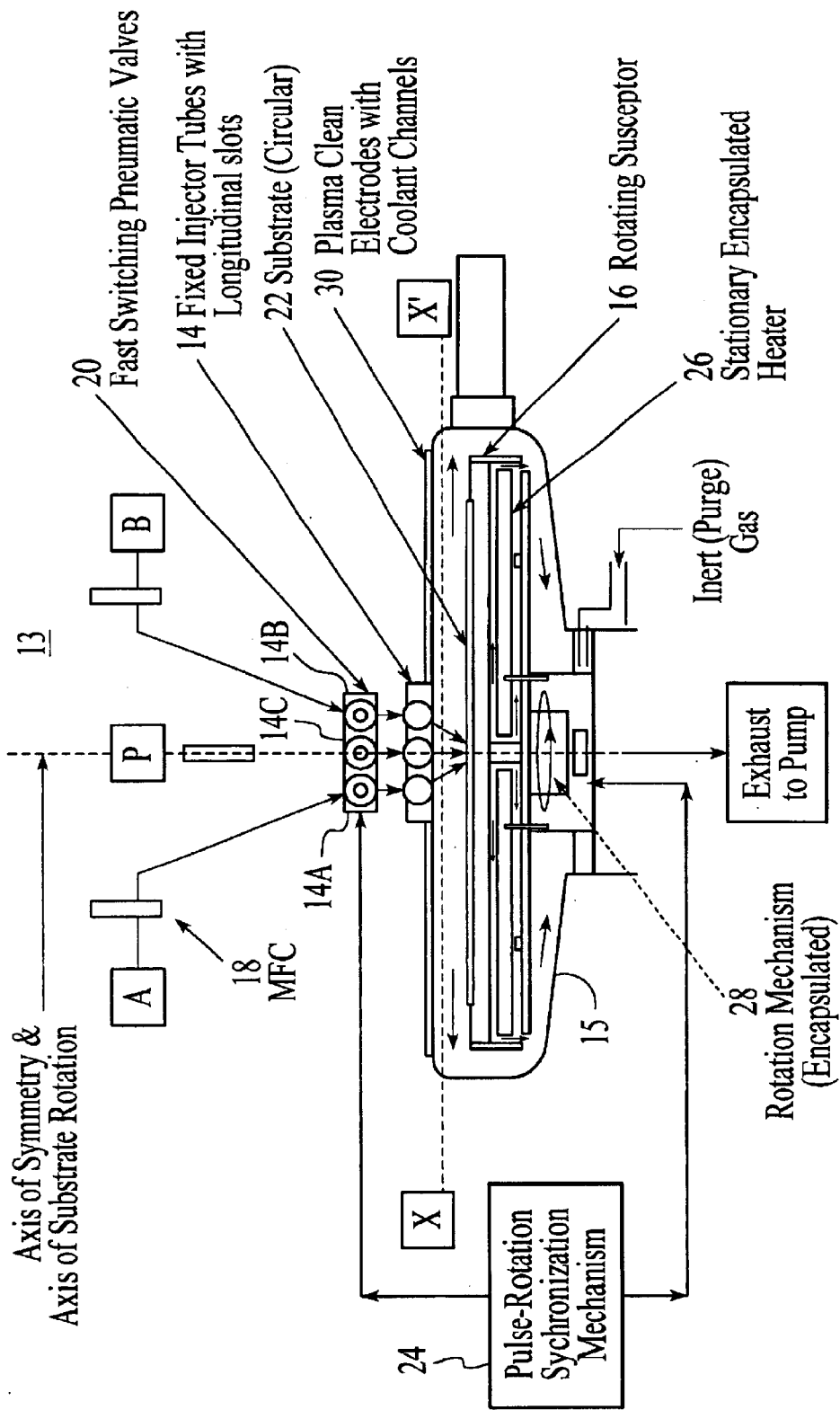
FIG. 4A shows the schematic of an ALD reactor with three fixed gas injector tubes and a rotating susceptor.

FIG. 4A shows a schematic of an ALD reactor 13 comprising a substantially cylindrical chamber 15 having a substrate processing region with three fixed gas injector tubes 14 and a rotating susceptor 16 for holing a wafer substrate 22. According to a preferred embodiment of the present invention, A and B are reactive gas supplies and P is an inert gas supply, which are provided by mass flow controllers 18. Gas jets emanating from slots in three fixed tubes 14A, 14B, and 14C impinge directly on the diagonal of a wafer substrate 22. A pulse-rotation synchronization mechanism 24 ensures that the rotating susceptor 16 rotates the substrate 22 in a horizontal plane around its vertical axis at a constant angular velocity in a synchronized fashion with the gas pulses, which are controlled by pneumatic values 20. Synchronization may not be entirely necessary as long as the wafer completes at least ½ rotation during the pulse width of the gases A, B and P.

Figure 4B:
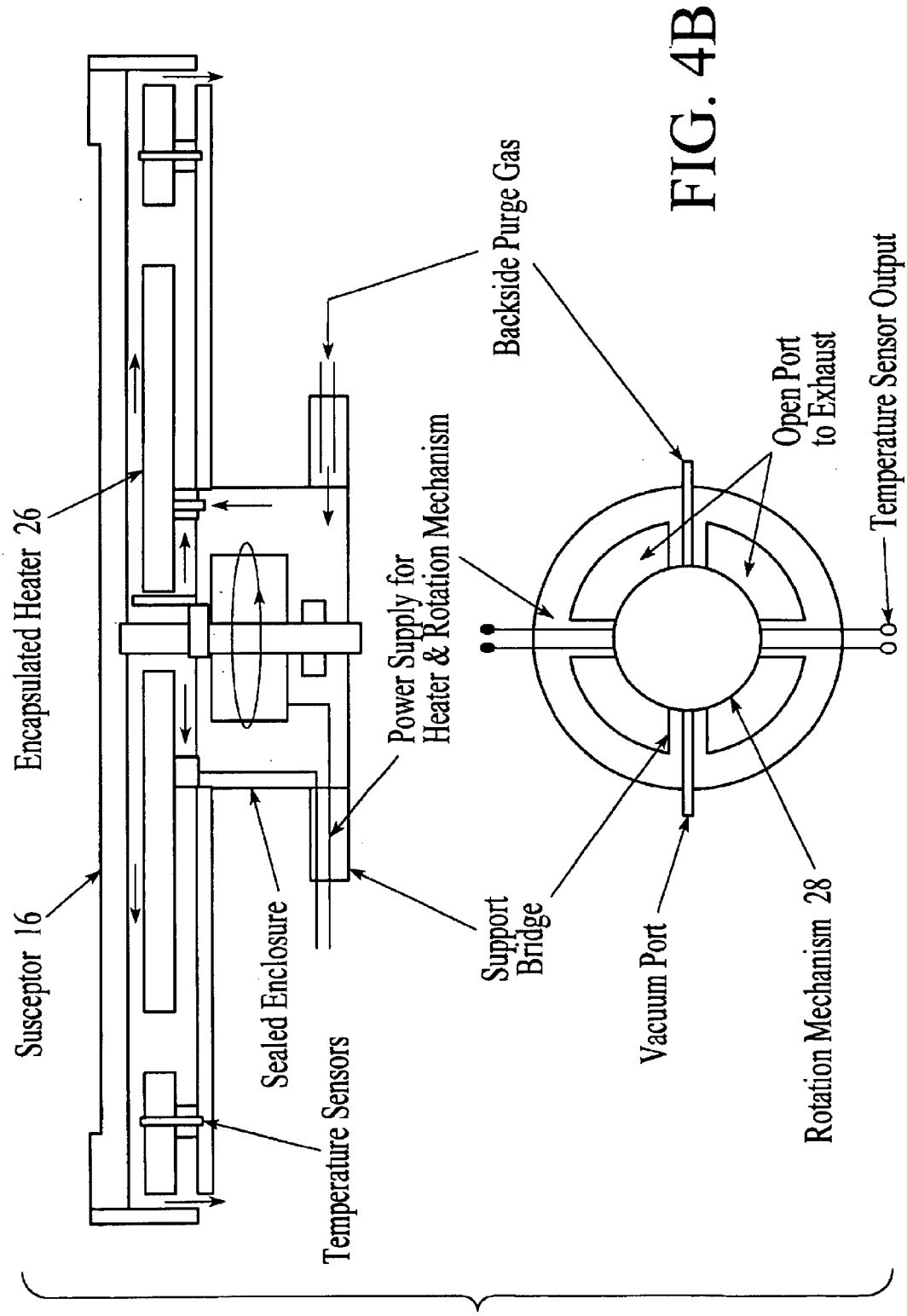
FIG. 4B shows the details of the susceptor, heater suport, rotation mechanism and purge gas assembly.

FIG. 4B shows the details of susceptor 16, encapsulated heater 26, rotation mechanism 28 and purge gas assembly. The susceptor 16 is a co-axially mounted pedestal that holds the substrate 22 in a horizontal plane with the gas injector tubes 14 directly opposite to it. A resistance or an infrared lamp heater 26 is mounted co-axially and directly underneath in close proximity to the susceptor 16 to heat the substrate 22 to a uniform and constant desired temperature in closed loop control mode. In a preferred embodiment, for the sake of simplicity of supplying the power to the heater 26, the heater 26 is either hermetically sealed and/or is housed in an enclosure 30 that is continuously being purged by an inert gas. The inert gas pressure inside enclosure 30 is maintained higher than the chamber pressure. The rotation device, also hermetically sealed and/or purged, to impart a constant angular motion to the susceptor 16 is mounted co-axially and directly underneath the heater 26. An inert gas flowing through the rotation device 28 and the heater cavity is subsequently bled in the gap between the susceptor 16 and heater 26 such that it flows radially outwards. Rotation of the susceptor 16 and the switching of pneumatic valves on each injector tube is precisely synchronized for maximum efficient operation of the reactor.

During the operation of the chamber, a first type of reactive gas or vapor (e.g. gas or vapor A) is injected through tube 14A by opening the pneumatic valve such that the gas or vapor jets strike the diagonal of the substrate 22. Synchronization mechanism ensures that the substrate 22 rotates through 180 degrees or one half of the complete rotation during which time period the first type of reactive gas or vapor is injected directly on the diagonal of the substrate 22. The pneumatic valve is closed as soon as half the substrate 22 rotation is completed. This ensures complete and uniform coverage of the substrate 22 mounted on the pedestal by the reactive gas or vapor. Subsequently, an inert gas (e.g. P) is pulsed on the substrate 22 diameter through tube 14C during the next half rotation of the substrate 22, thus completing a one full substrate 22 rotation. In a similar fashion, the substrate 22 is sequentially treated to the pulse from a second type of reactive gas or vapor (e.g. gas/vapor B) through tube 14B that is followed by an inert gas pulse (e.g. P) through tube 14C, each pulse having a width of at least half the substrate 22 rotation. Thus, during four consecutive gas or vapor pulses the substrate 22 holding pedestal rotates through at least two complete rotations. This completes one atomic layer chemical vapor deposition or ALD cycle that is repeated for a desired number of times.

Referring again to FIG. 4A, the ALD reactor is provided with capabilities for in-situ plasma clean. Two radio frequency (RF) electrodes 30, symmetrically positioned with respect to the fixed gas injector tubes 14, can be used for this purpose. The RF electrodes 30 consist of flat plates, with coolant channels grooved across their surfaces, that occupy the remnant of the area of the top surface of the reactor. A suitable means of excitation can be applied to these electrodes 30 and a suitable gaseous mixture of gases containing fluorine, chlorine or similar atoms can be injected from the tubes to strike a plasma and generate active species within the reactor.

Figure 5:
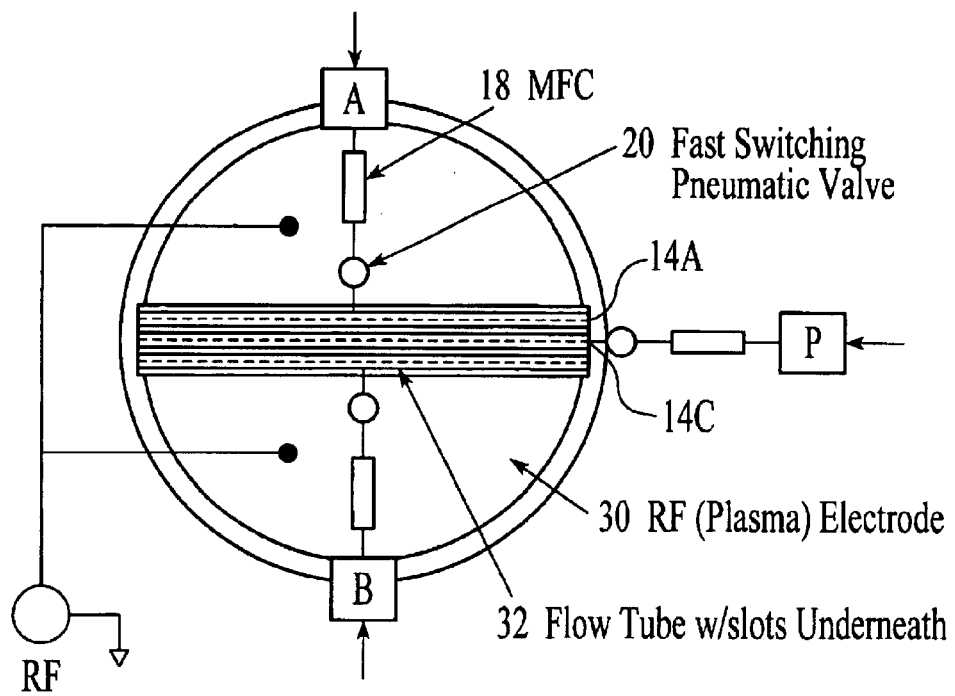
FIG. 5 shows the top view of the ALD reactor with RF electrodes for generating a suitable plasma.

FIG. 5 shows the top view of the ALD reactor with RF electrodes 30 for generating a suitable plasma. Also shown are three gas injector tubes 14 and gas supply lines each with an MFC 18 and a fast switching pneumatic valve 20. The longitudinal apertures 32 in the injector tubes 14 face downward towards the substrate 22 and are shown for the sake of explanation only. The part of the ALD reactor as shown in FIG. 4A, below the cross-section line X–X' remains unchanged.

Referring back to FIG. 4A, the top portion of the reactor can be opened and is attached to the main body of the reactor with suitable means and an O-ring to maintain vacuum tight seal that is necessary to achieve clean and reproducible processing. The cross-section line X–X' as shown in FIG. 4A, separates the lid from the body of the ALD reactor. The body of the reactor may be made of suitable material such as aluminum and/or stainless steel and has a provision for coolant channels within itself so as to maintain the reactor wall temperature constant during processing.

One of the most important conditions under which the gas pulses can be rapidly switched is the minimization of the dead volume between the pneumatic valve 20 and the injector tube 14 and also within the reactor itself. The former can be achieved by installing the pneumatic valve 20 as close as possible to the injector tube(s) 14. While later can be achieved by careful optimization of the distance of separation between the tubes 14 or the upper plenum and the substrate plane.

Figure 6:
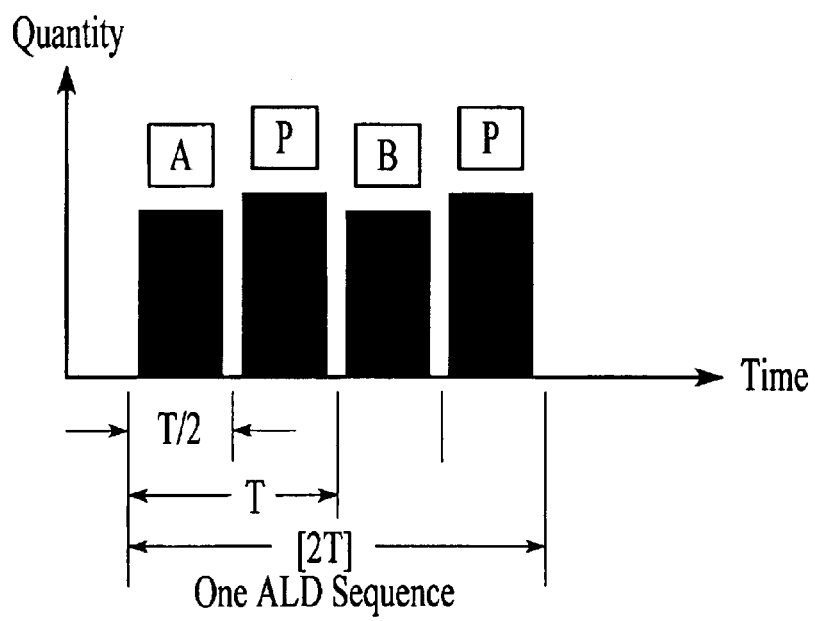
FIG. 6 shows the gas pulse-rotation synchronization for a typical ALD deposition sequence, where T is the time required for one complete rotation of the substrate around its vertical axis and the Y-axis denotes quantity of the gas at an arbitrary scale.

In a preferred embodiment of the present invention, the pulse-rotation synchronization mechanism 24 is provided to increase the efficiency of the ALD reactor as shown schematically in FIG. 4A. If the time for one complete substrate rotation around its vertical axis is denoted by T seconds, then the one gas pulse (either reactive or inert) is completed in T/2 seconds. Thus, one complete ALD deposition sequence is completed in 2T seconds as shown in FIG. 6. FIG. 6 shows the gas pulse-rotation synchronization for a typical ALD deposition sequence, where T is the time required for one complete rotation of the substrate around its vertical axis and the Y-axis denotes quantity of the gas at an arbitrary scale and the ALD sequence is shown as [A, P, B, P].

Operation of an ALD reactor in CVD mode may also be realized in the event when both the reactive gases and vapor flows A and B are initiated simultaneously by opening the respective pneumatic valves together. Under such a circumstance, the jets emanating from the both the reactive gas or vapor injectors impinge on the diagonal of the substrate, in close vicinity of each other, that is set in angular motion around its axis. Higher deposition rates may be realized, than normally attainable in an ALD mode, in this type of reactor operation.

There are several possible variations to the ALD reactor configuration described in FIGS. 4A and 4B that can achieve atomic layer deposition of thin films. To an individual skilled in the art, however, they are well within the scope of this invention.

EXAMPLE 1

Figure 7:
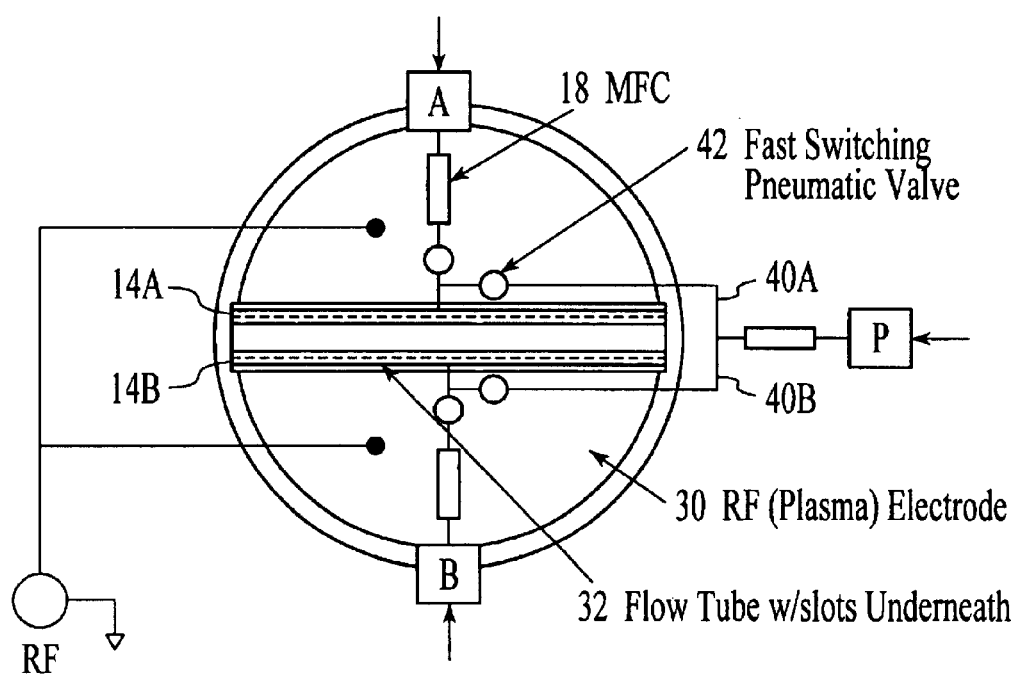
FIG. 7 shows the top view of an alternative configuration of an ALD reactor with RF electrodes for generating a suitable plasma.

In an alternate embodiment of the ALD reactor, only the top of the ALD reactor as described schematically in FIG. 5 is suitably modified, as shown in FIG. 7. FIG. 7 shows a top view of an alternative configuration of an ALD reactor with RF electrodes for generating a suitable plasma. In this embodiment of an ALD reactor, A and B constitute reactants but the tube at the center carrying the purge gas P is substituted by bifurcating the purge gas inlet in to two separate purge gas lines 40A and 40B with an individual fast switching pneumatic valve 42 in series, so that purge gas P is supplied to both the reactive gas injector tubes 14A and 14B. In such a configuration, the purge gas P adds to the momentum of the reactive gases A and B and it can also help purge the injector tubes and sweep away any excess of either of the reactant accumulated on the substrate. The part of the ALD reactor, as shown in FIG. 4A, below the line X–X' remains unchanged. The ALD deposition sequence in such a configuration can be best described as [A+P, P, B+P, P]. However, the process sequence [A, P, B, P] can also be implemented.

EXAMPLE 2

Figure 8:
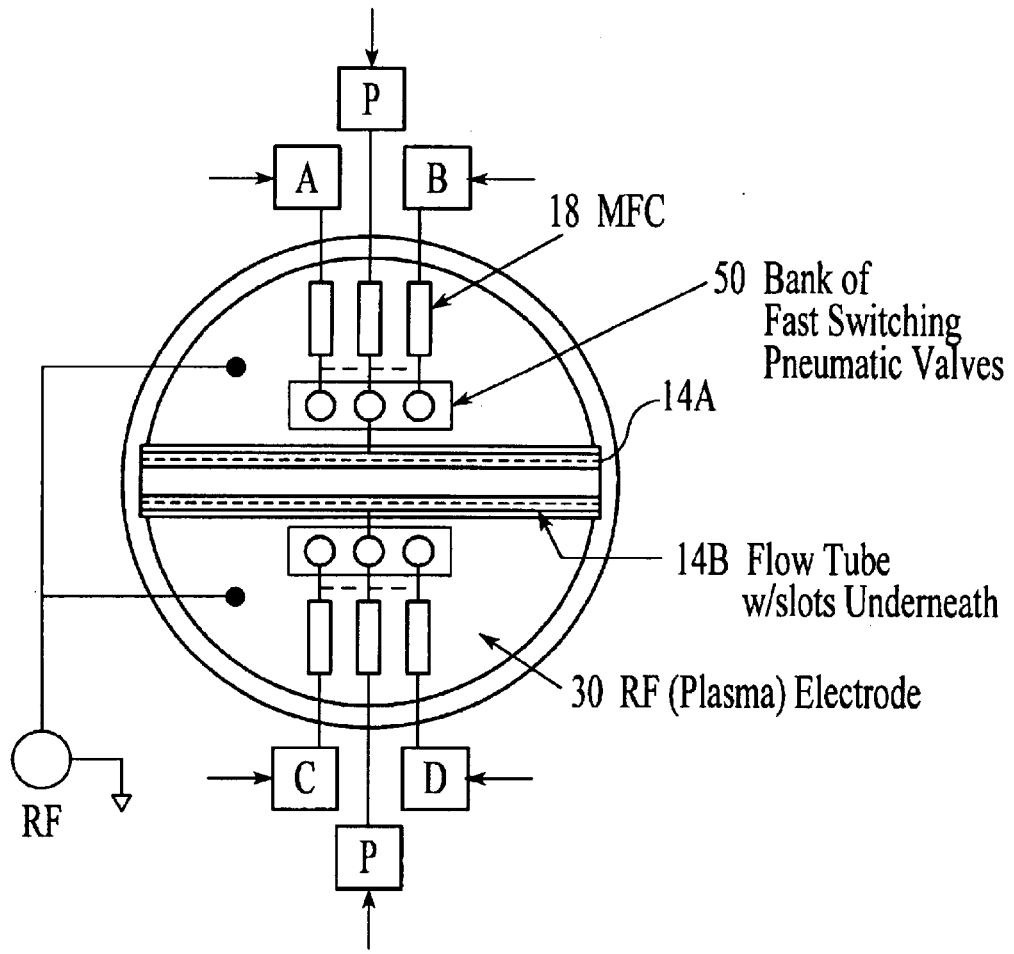
FIG. 8 shows the top view of an alternative configuration of an ALD reactor with multiple gas inlets for fabrication of atomic layers of non-stoichiometric materials.

In another embodiment of the present invention, the top portion of an ALD reactor can be further modified to deposit atomic layers of non-stoichiometric materials such as SixGe1−x, or AlxGa(1−x)As. Fabrication of such materials many require as many as four different reactants. These reactants can be categorized in to two sub-groups of reactants that are highly reactive towards each other. For example, one such group of reactants is hydrides and another one is halides of elements such as germanium and silicon. The top of the ALD reactor as described in FIG. 7 can be modified to accommodate the varied number and types of reactants and an inert gas purge as shown in FIG. 8. FIG. 8 shows the top view of an alternative configuration of an ALD reactor with multiple gas inlets for fabrication of atomic layers of non-stoichiometric materials. The penumatic valves 50 are placed in a bank of three together. The pneumatic block 50 has a common outlet that opens into the injector tubes 14A and 14B. A, B, C and D constitute reactants whereas P is an inert gas purge. The part of the ALD reactor, as shown in FIG. 4A, below the line X–X' reamins unchanged. As a variation of this configuration, the inert gas P can be mixed with the respective reactants upstream as shown by the dashed line.

EXAMPLE 3

Figure 9:
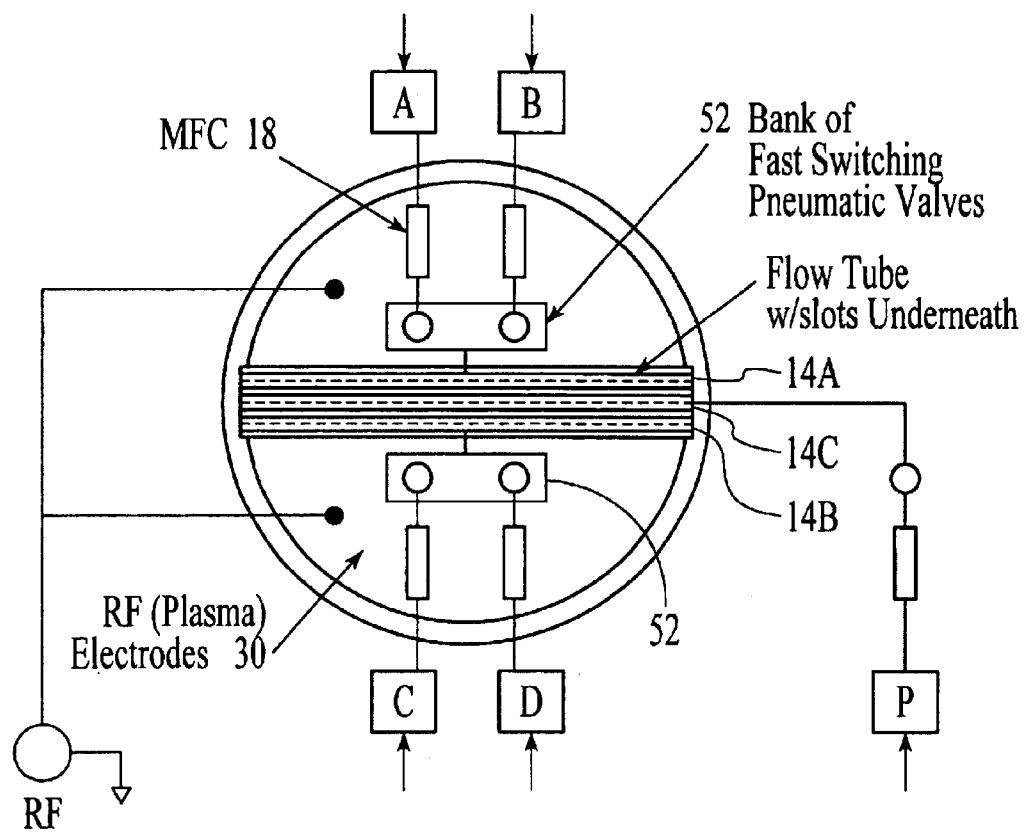
FIG. 9 shows the top view of an alternative configuration of an ALD reactor multiple gas inlets for fabrication of atomic layers of non-stoichiometric materials.

The ALD reactor configuration as described in FIG. 8 can be simplified by incorporating a separate inert gas injector tube. FIG. 9 shows the top view of an alternative configuration of an ALD reactor multiple gas inlets for fabrication of atomic layers of non-stoichiometric materials. Two pneumatic blocks 52 are provided where two pneumatic valves are placed in a bank 52 with minimum dead place. Each pneumatic block 52 has a common outlet that opens in to the injector tubes 14A and 14B, respectively. A, B, C and D constitute reactants whereas P is an inert gas purge that is injected through the injector tube 14C. The part of the ALD reactor, as shown in FIG. 4A, below the line X–X' reamins unchanged.

DESCRIPTION OF ALTERNATE EMBODIMENTS

There are a variety of other configurations that can potentially satisfy previously described conditions necessary to adapt the technology of atomic layer deposition (ALD) to deposit large area, atomically uniform and highly conformal thin films. These configurations are deemed equally promising to achieve the desired results.

EXAMPLE 4

In the foregoing discussion, the gas injector tubes 14 have been largely longitudinal ones in shape. Thus, it is imperative that to achieve complete coverage, the substrate must be rotated through at least 180 degrees.

Figure 10A:
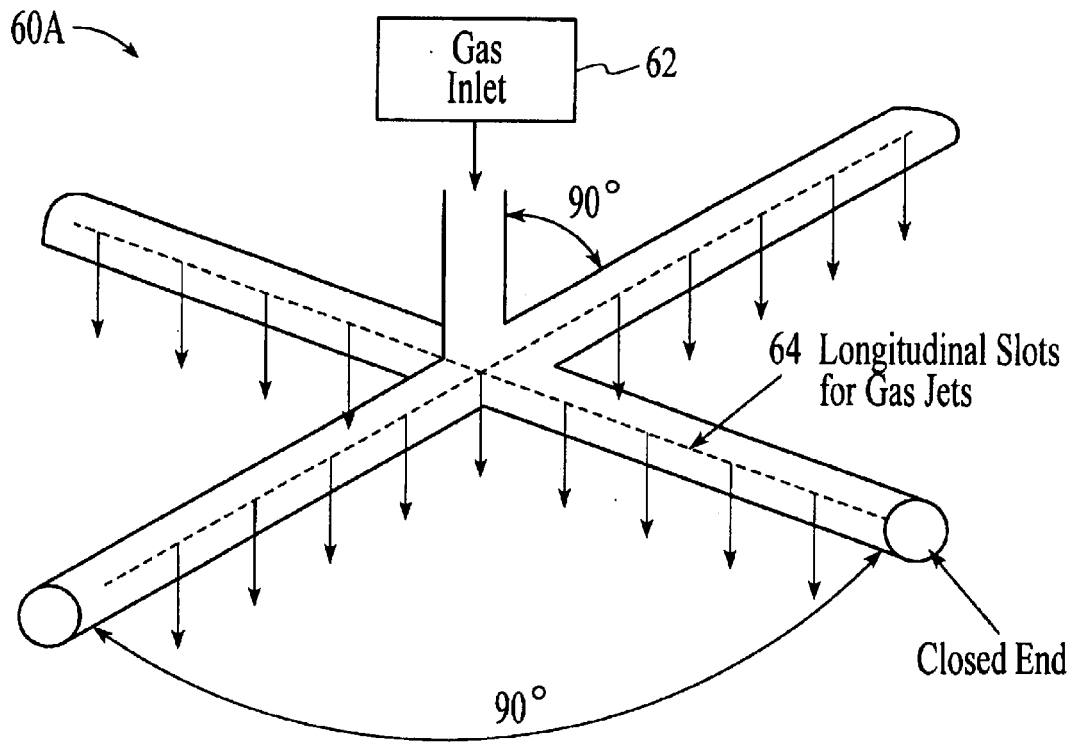
FIG. 10 shows the schematic of cross injector tube assembly.
Figure 10B:
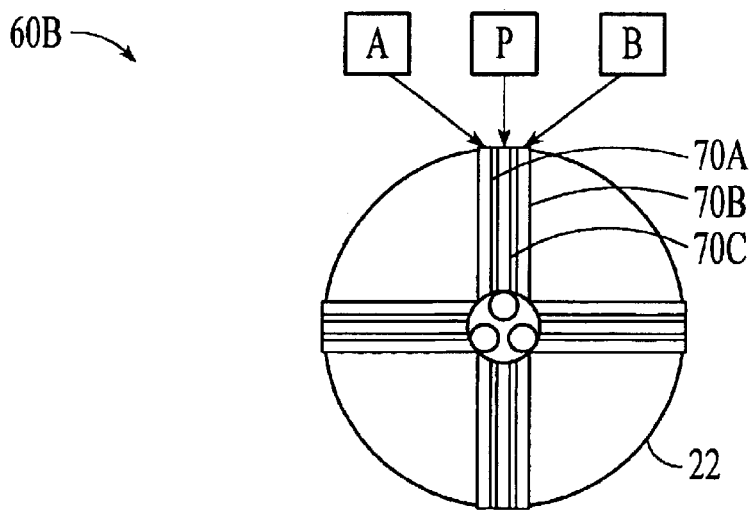

The ALD reactor configuration can be suitably modified by replacing the longitudinal injector tube by a simple cross, such as plus sign (+) with four arms as shown schematically in FIGS. 10(a) and 10(b), which show a schematic of a cross injector tube 60. FIG. 10(a) shows an individual cross injector 60A with a gas inlet 62 and longitudinal downward slots 64. FIG. 10(b) is a top view of a cross injector 60B having three cross injector tubes 70A, 70B, and 70C combined in close proximity with individual gas inlets. The cross injectors 60A and 60B can be employed in the top part of an ALD reactor described in detail in FIG. 4A above the line X–X'. It is well understood that to achieve complete coverage by any one type of reactant with a cross injector 60, however, the substrate 22 needs to be rotated only through at least 90 degrees. This can potentially speed up the ALD process cycle by completing the cycle just one full rotation. However, increase in path length, spacing of two or three separate and concentric cross injectors 70 in the vicinity of each other and shortening of the rotation span must be carefully balanced with pulse-rotation synchronization. Thus, a cross injector tube 60 with larger number of branches may offer a few advantages over a longitudinal injector, however, the benefits and complexities involved must be carefully weighed.

EXAMPLE 5

Figure 11A:
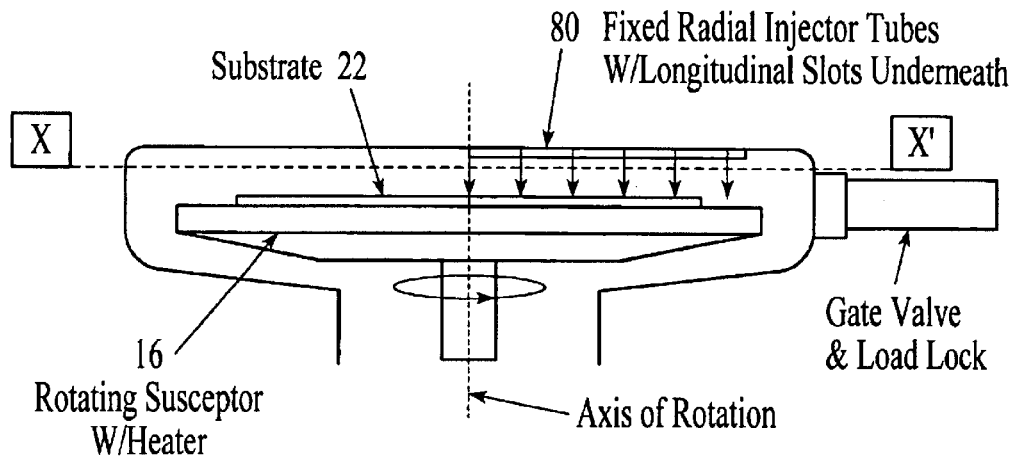
FIG. 11 shows the schematic of an ALD reactor with radial gas injector configuration.
Figure 11B:
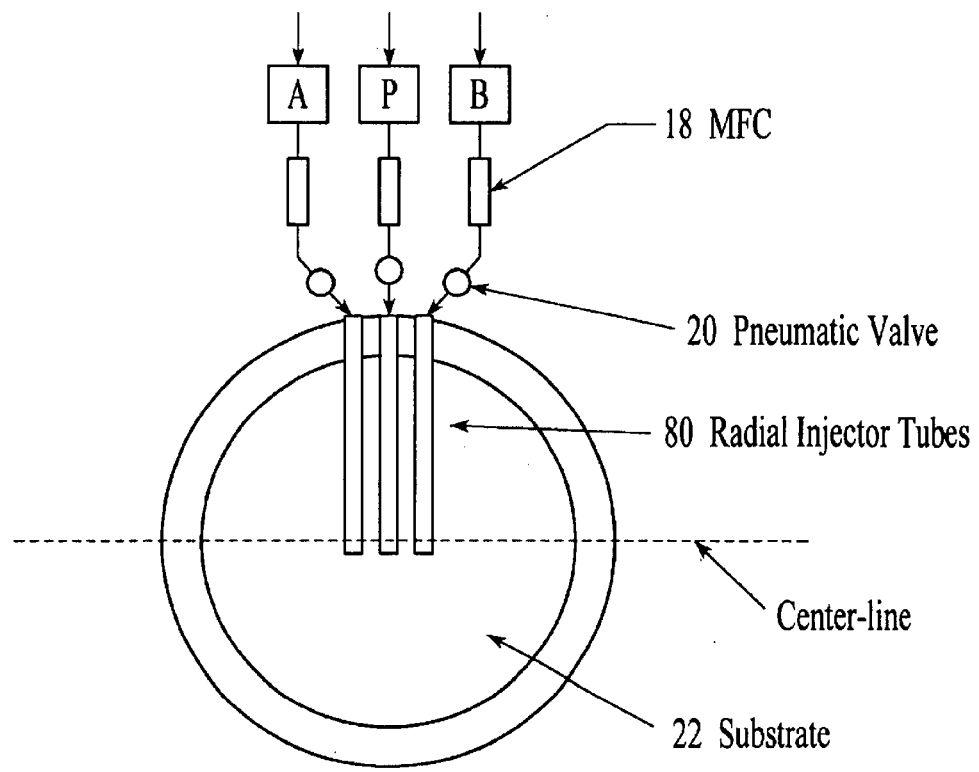

FIGS. 11(a) and 11(b) which show a schematic of another ALD reactor configuration in which longitudinal injector tubes are replaced by radial injector tubes 80 that extend inwards from the circumference of a substrate 22 towards and a short distance beyond its center. FIG. 11(a) shows a vertical cross sectional view, and FIG. 11(b) shows a top view of the ALD reactor with radial tubes 80, injecting on a radius that is directly below the center injector tube. The part of the ALD reactor, as shown in FIG. 4A below the line X–X' reamins unchanged. The details of the configuration as shown in FIGS. 4A and 4B are omitted for simplicity.

In such gas injection scheme, the reactants are injected on a rotating substrate 22 from the tubes 80 projecting on the same radius of the largely circular substrate 22 that is set in circular motion at a constant angular speed. The radial injector tubes 80, can be employed in the top part of an ALD reactor described in detail in FIG. 4A above the line X–X'. The length of an injector tube is intentionally made larger than the radius of the substrate in order to provide coverage at the center of the substrate 22.

Such an ALD reactor configuration requires that the substrate 22 must be rotated through at least one full rotation during a gas pulse in order to achieve complete coverage by the reactant or purge gas. It is thus imperative that one complete ALD process cycle can be completed through four complete rotations of the substrate 22 around its vertical axis.

EXAMPLE 6

Figure 12:
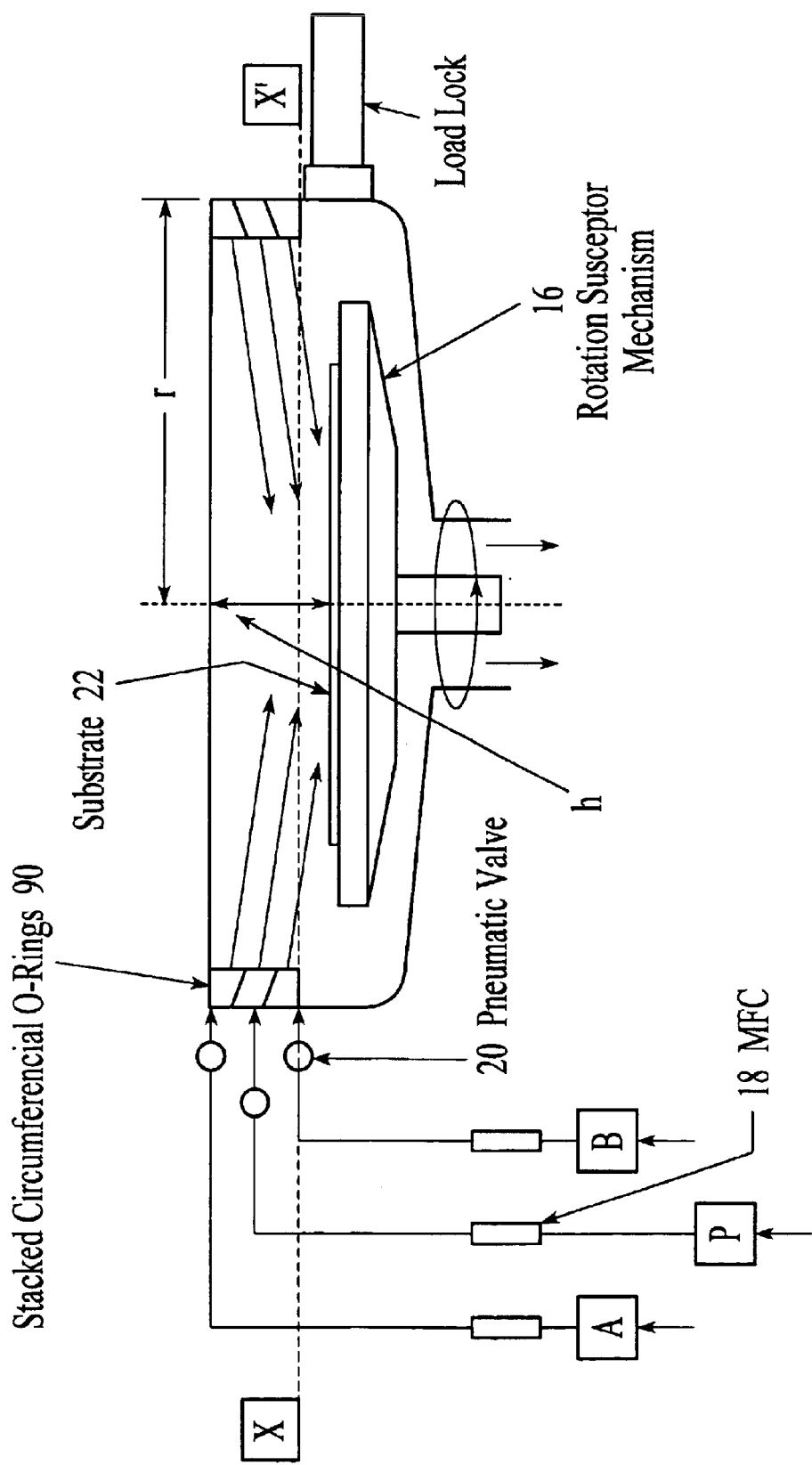
FIG. 12 shows the Schematic of an ALD reactor with gas injection on a rotating substrate with stacked, peripheral O-rings.

An alternative ALD reactor configuration is described schematically in FIG. 12. FIG. 12 shows the Schematic of an ALD reactor with gas injection on a rotating substrate 22 with stacked, peripheral O-rings 90. The part of the ALD reactor, as shown in FIG. 4A below the line X–X' reamins unchanged. The details of the configuration as shown in FIGS. 4A and 4H are omitted for simplicity.

In such a configuration, the reactants are injected from circular O-rings 90 placed in individual planes above the substrate 22 and are stacked closely. The O-rings 90 have apertures that project the reactant or purge gas stream on the wafer in such way that it completely covers the substrate 22. The substrate 22 may be rotated to enhance its complete coverage. However, it may become apparent to an individual skilled in the art, that such an ALD reactor configuration may obviate the substrate rotation as the O-ring 90 injects the gas from all sides on the circular substrate 22. The critical limiting factors, to realize a large area uniform ALD process in such a configuration, are mainly the volume of the reactor and path length of the gas (circumference) of the O-rings 90.

The volume of the ALD reactor V, is defined as follows:

$$V=\pi(r*2)h \qquad (2)$$

Here, r is the radius of the chamber and h is the chamber height. It is also understood that height h of the chamber is closely related to the angle of inclination of the gas stream.

The circumference of the ALD reactor L is defined as follows:

$$L = 2\pi R \quad (3)$$

Both of which determine the path length and thus the residence time of gas in the ALD process chamber. It is thus imperative that the gas, from the point of injection into the O-ring 90 must cover the path length equal to half of the circumference and additionally at least twice the radius of the substrate 22 before it is completely removed from the surface of the substrate 22. Thus the minimum path length "d", of the gas in such a configuration is defined as:

$$d = \pi \cdot r + 2r \quad (4)$$

EXAMPLE 7

Figure 13A:
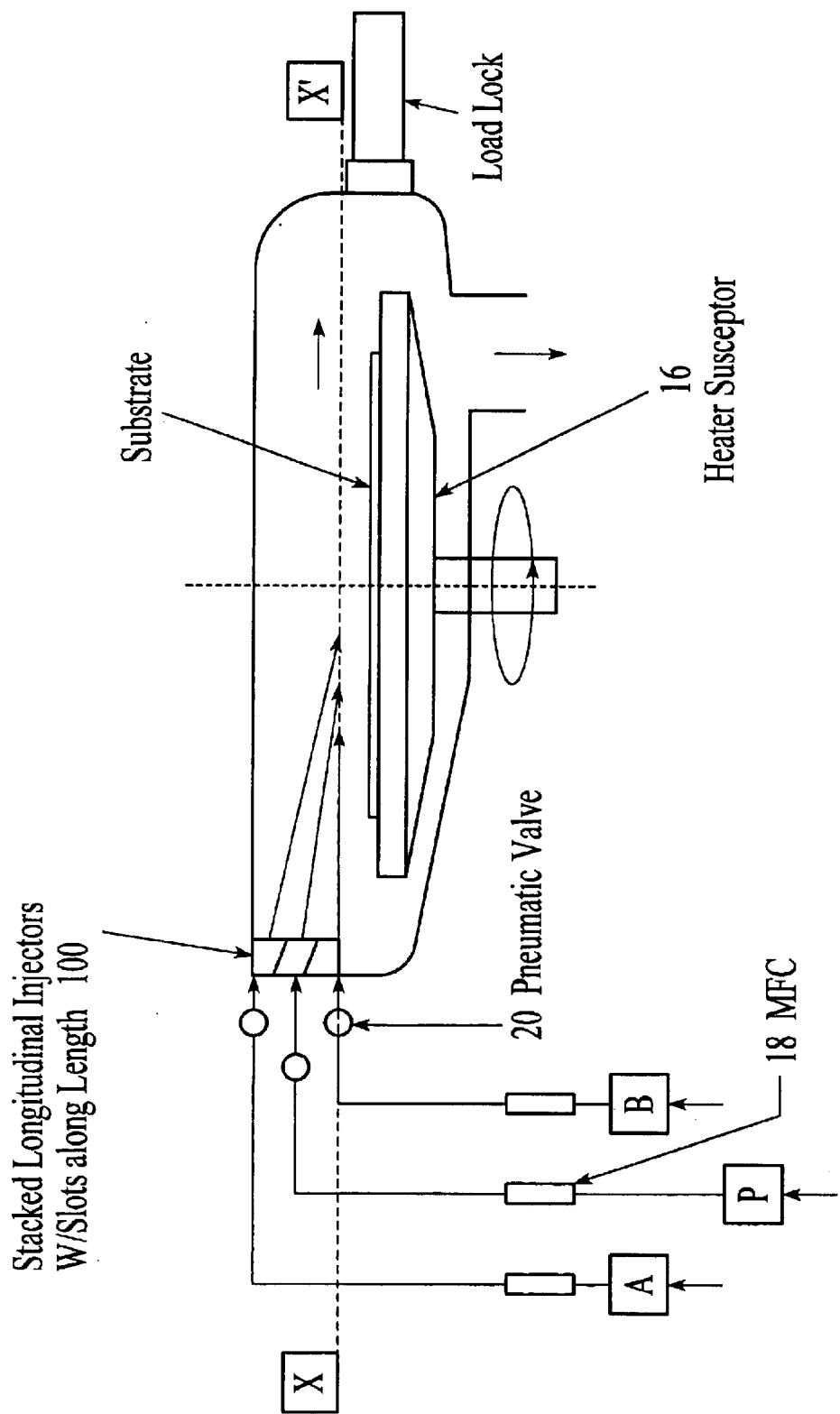
FIG. 13 shows the lateral gas injection from stacked and longitudinal gas injectors on a rotating substrate.
Figure 13B:
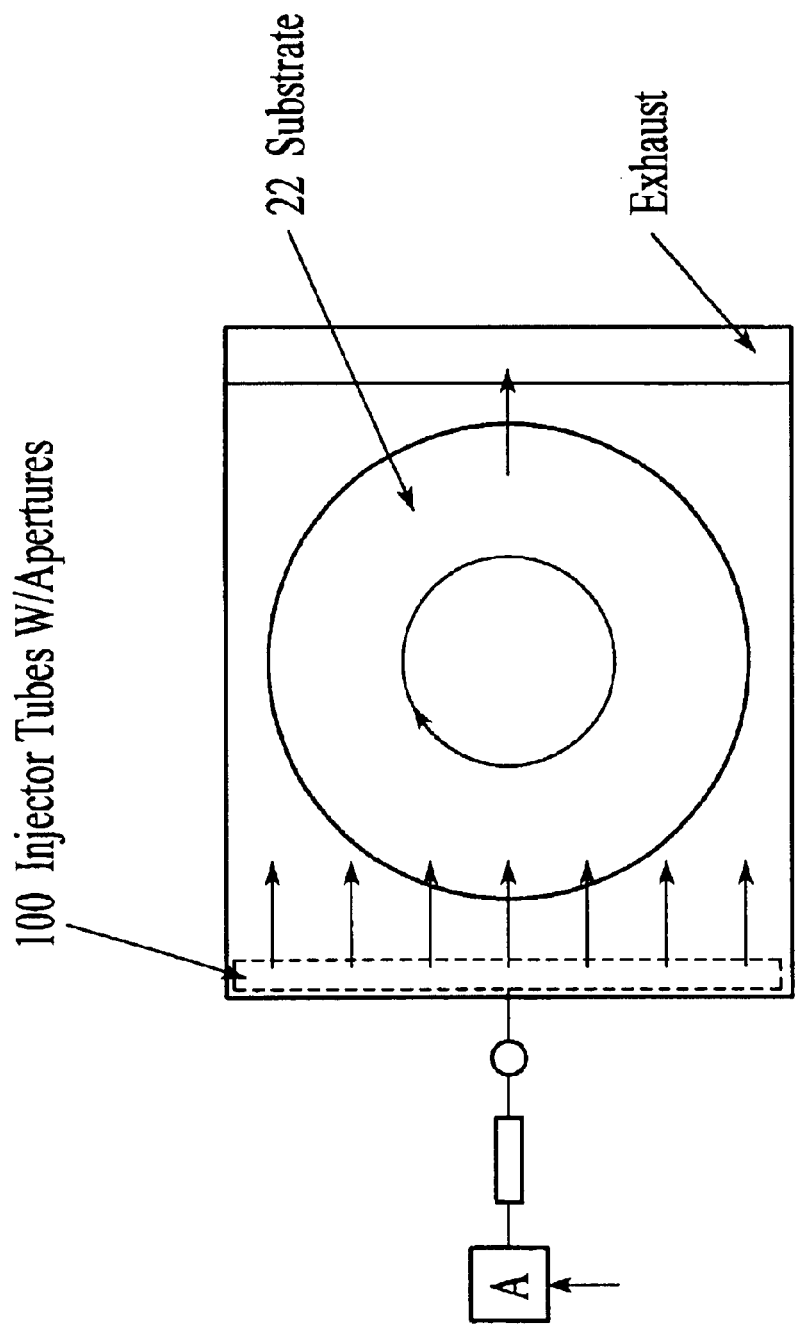

FIGS. 13(*a*) and 13(*b*) show lateral gas injection from stacked and longitudinal gas injectors 100 on a rotating substrate 22. FIG. 13(*a*) shows a side view and FIG. 13(*b*) shows a top view of the stacked longitudinal injectors 100. The part of the ALD reactor shown in FIG. 4A below the line X–X' reamins unchanged. The details of the configuration as shown in FIGS. 4A and 4B are omitted for simplicity. In this ALD reactor configuration, the substrate 22 is located approximately midway between the injector tubes 100 that are stacked substantially in a horizontal plane and the exhaust that is situated diametrically at the opposite end of the reactor from the injector tubes 100. The reactants and purge gas jets impinge on the substrate in the vicinity of its diameter. The substrate 22 is set in an angular motion around its vertical axis in horizontal plane during the gas pulses.

EXAMPLE 8

Figure 14:
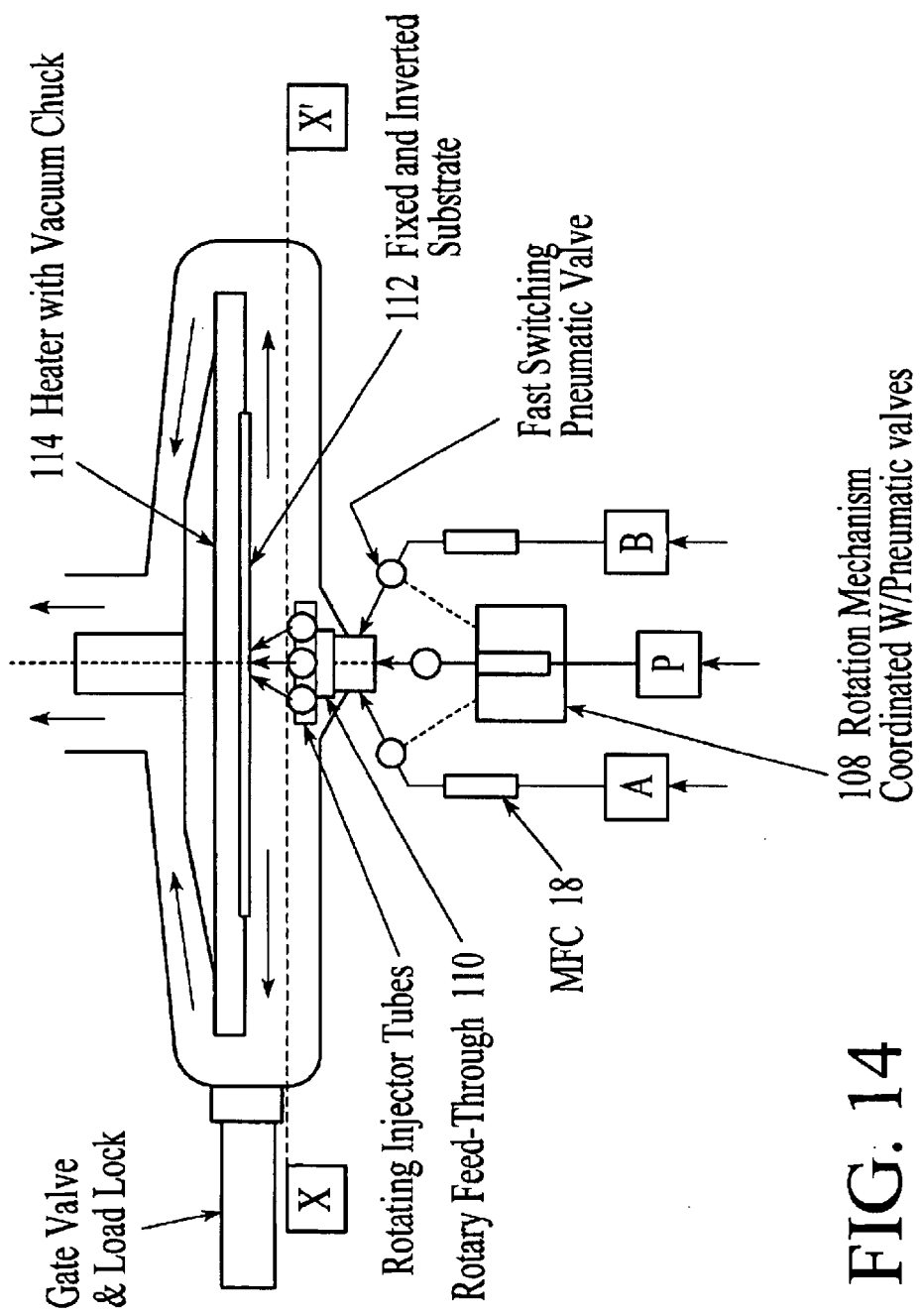
FIG. 14 shows the schematic of an inverted ALD reactor with a stationary "upside-down" substrate and rotating injector tubes providing an upward flow injection.

FIG. 14 shows the schematic of an inverted ALD reactor 106 with stationary "upside-down" substrate 112 and rotating injector tubes 110 with upward flow injection. In this ALD reactor configuration, the reactants are injected upwards through rotating injector tubes 110 at a stationary substrate 112 that is held face down horizontally abut to the heater 114 with a suitable arrangement such as a vacuum chuck. The substrate is held in position with the help of the vacuum chuck from backside. The configuration of the ALD reactor below line X–X' as described in FIG. 4A remains largely unchanged, except the rotary mechanism. The rotary mechanism 108 configuration is integrated with fast switching pneumatic valves at the bottom of the inverted ALD reactor.

In this particular configuration, the rotation mechanism 108 is placed outside and underneath the ALD reactor 106. The wafer is clamped closely to a heater from behind for efficient heat exchange. The reactants and the purge gas are separately injected into the stationary part of the reactor 106 that is attached to its body. The stationary part in turn feeds each gas into an individual leak-proof rotary feed-through that is attached to each injector tube 110.

In such an ALD reactor configuration the injector tubes 110, that are placed in close proximity to each other, and are rotated simultaneously and parallel to each other in a horizontal plane that is substantially parallel to the substrate plane. The reactants subsequent to impinging on the substrate surface 112, flow outwards and depart above and behind the heater from an outlet that is attached to exhaust and/or pump.

EXAMPLE 9

It is also conceivable that the substrate be rotated in an inverted ALD reactor 106 configuration with stationary injector tubes at the bottom to inject reactants onto a substrate 112 that is held face down and rotated in a horizontal plane. Such a configuration is exactly similar to the one that is described in detail earlier in FIG. 4, except with one minor difference that it has an additional wafer holding mechanism, such as a vacuum chuck, incorporated within the susceptor. This arrangement enables the operator to hold, rotate and uniformly heat the substrate face down in a horizontal plane during the processing.

Although the present invention has been described in accordance with the embodiments shown, one of ordinary skill in the art will readily recognize that there could be variations to the embodiments and those variations would be within the spirit and scope of the present invention. For example, although the present invention has been described in terms of a preferred embodiment where a wafer substrate is coated with layers of films by the ALD, any type of substrate, such as tools, which need layers of films may also be placed within the ALD. Accordingly, many modifications may be made by one of ordinary skill in the art without departing from the spirit and scope of the appended claims.

What is claimed is:

1. An atomic layer deposition (ALD) reactor, comprising:
   a substantially cylindrical chamber;
   a substrate mounted within the chamber; and
   at least one injection tube mounted within the chamber having a plurality of apertures along one side that direct gas emanating from the apertures towards the substrate, wherein the substrate is covered with a gas deposition sequence comprising a first reactive gas (A), an inert gas (P), the second reactive gas (B), and the inert gas (P),
   wherein while gas is pulsed from the injection tube, the substrate is stationery within the chamber and the at least one injector tube is rotated in a longitudinal plane in relation to the substrate to ensure complete and uniform coverage of the substrate by the gas.

2. The ALD reactor of claim 1 wherein the one injection tube comprises a first injection tube, the ALD reactor further including a second injection tube and a third injection tube mounted within the chamber parallel and in close proximity to opposite sides of the first injection tube.

3. The ALD reactor of claim 2 wherein the first injection tube dispenses gas P, the second injection tube dispenses gas A, in the third injection tube dispenses gas B.

4. The ALD reactor of claim 1 wherein the at least one injection tube comprises a cross injector tube configuration.

5. The ALD reactor of claim 1 wherein the at least one injection tube comprises a radial gas injector configuration.

6. A method for depositing an atomic layer of a solid film on a wafer substrate, comprising the steps of:
   (a) placing at least one injector tube substantially parallel and in proximity to the substrate, wherein the injector tube includes a plurality of slots for gas flow towards the substrate;
   (b) pulsing a first reactive gas through the injector tube to chemically saturated the substrate;
   (c) pulsing an inert gas through the injector tube to remove an excess of the first reactive gas, creating a chemisorbed mono-layer of the first-gas;
   (d) pulsing a second reactive gas through the injector tube to form one layer of the film;
   (e) pulsing the inert gas through the injector tube to remove an excess of the second reactive gas; and
   (f) continuously rotating one of the substrate and the at least one injector tube in relation to one another during the pulsing steps, wherein a time for one complete substrate rotation is denoted by T seconds, one gas pulse is completed in T/2 seconds, and a deposition sequence of the first reactive gas, the inert gas, the second reactive gas, and the inert gas is completed in 2T seconds.

7. The method of claim 6 further including the step of fixing the injection tube in place and rotating the substrate in relation thereto.

8. The method of claim 7 further including the steps of:

providing cross-injector tubes for pulsing the gases;

rotating the substrate at least 90 degrees during each of the gas pulses; and completing a deposition sequence of the first reactive gas, the inert gas, the second reactive gas, and the inert gas in a 360 degree rotation of the substrate.

9. The method of claim 7 further including the steps of:

holding the substrate face-down; and pulsing the gases upward towards the substrate through the at least one injector tube.

10. The method of claim 6 further including the step of pulsing the gases through longitudinal injector tubes located parallel to the substrate having spaced apertures for directing gas towards the substrate.

11. The method of claim 10 further including the step of rotating the substrate through at least 180 degrees during each of the gas pulses.

12. The method of claim 6 further including the steps of:

holding the substrate stationery; and rotating the at least one injector tube in relation thereto.

13. An atomic layer deposition (ALD) reactor, comprising:

a substantially cylindrical chamber, the cylindrical chamber having a diagonal;

a rotatable pedestal mounted coaxially within the chamber for holding a wafer substrate, the wafer substrate having a diagonal; and at least one injection tube mounted within the chamber opposite to the rotatable pedestal and located substantially along the diagonal of the chamber, the injection tube having a plurality of spaced openings facing the rotatable pedestal, such that gas emanating from the openings in the injection tube impinge upon the diagonal of the wafer substrate, wherein while gas emanates from the injection tube, the rotatable base rotates around its axis at a predefined velocity to coaxially rotate the wafer substrate in a longitudinal plane within the chamber to ensure complete and uniform coverage of the wafer substrate by the gas.

14. The ALD reactor of claim 13 wherein the injection tube has at least one end closed.

15. The ALD reactor of claim 14 further including a gas inlet coupled to the center of the injection tube.

16. The ALD reactor of claim 14 further including a gas inlet coupled to an open end of the injection tube.

17. The ALD reactor of claim 13 wherein the injection tube comprises a first injection tube, the ALD reactor further including a second injection tube, and the third injection tube located parallel and in close proximity to opposite sides of the first injection tube.

18. The ALD reactor of claim 17 wherein the first injection tube is coupled to an inert gas source, the second injection tube is coupled to a first reactive gas source, and the third injection tube is coupled to a second reactive gas source.

19. The ALD reactor of claim 18 wherein the rotatable pedestal includes a heater for supplying heat energy to the wafer substrate to affect a desire chemical reaction.

* * * * *